United States Patent
Kim et al.

(10) Patent No.: US 7,985,347 B2
(45) Date of Patent: Jul. 26, 2011

(54) METHODS OF FORMING A PATTERN AND METHODS OF MANUFACTURING A CAPACITOR USING THE SAME

(75) Inventors: Kyoung-Mi Kim, Anyang-si (KR); Young-Ho Kim, Yongin-si (KR); Myung-Sun Kim, Daegu (KR); Jae-Ho Kim, Yongin-si (KR); Chang-Ho Lee, Suwon-si (KR); Seok Han, Hwaseon-si (KR)

(73) Assignee: Samsung Electronics Co., Ltd. (KR)

( * ) Notice: Subject to any disclaimer, the term of this patent is extended or adjusted under 35 U.S.C. 154(b) by 797 days.

(21) Appl. No.: 12/002,052

(22) Filed: Dec. 14, 2007

(65) Prior Publication Data

US 2008/0142474 A1 Jun. 19, 2008

(30) Foreign Application Priority Data

Dec. 18, 2006 (KR) .................. 10-2006-0129346

(51) Int. Cl.
*C03C 25/68* (2006.01)
*C23C 1/00* (2006.01)
*H01L 21/20* (2006.01)
(52) U.S. Cl. .............. 216/58; 216/39; 216/83; 438/381; 438/689
(58) Field of Classification Search .................... 216/58, 216/6, 39, 41, 57, 83; 438/243, 381, 689; 528/33
See application file for complete search history.

(56) References Cited

U.S. PATENT DOCUMENTS

2007/0026625 A1* 2/2007 Chung et al. .................. 438/396

FOREIGN PATENT DOCUMENTS

| KR | 10-2006-0007681 | 1/2006 |
| KR | 10-0597599 | 6/2006 |
| KR | 10-2006-0074978 | 7/2006 |

OTHER PUBLICATIONS

Siloxanes—Consumption, Toxicity and Alternatives. Environmental Project No. 1031. Danish Environmental Protection Agency. Sep. 2005.*
Yang, Chang-Chung; Chen, Wen-Chang. The structurea dn properties of hydrogen silsesquioxane films produced by thermal curing. The Royal Society of Chemistry. Feb 22, 2002.*

* cited by examiner

*Primary Examiner* — Nadine G Norton
*Assistant Examiner* — Patti Lin
(74) *Attorney, Agent, or Firm* — Mills & Onello LLP

(57) ABSTRACT

In a method of forming a pattern and a method of forming a capacitor, an oxide layer pattern having an opening is formed on a substrate. A conductive layer is formed on the oxide layer pattern and the bottom and sidewalls of the opening. A buffer layer pattern is formed in the opening having the conductive layer, the buffer layer pattern including a siloxane polymer. The conductive layer on the oxide layer pattern is selectively removed using the buffer layer pattern as an etching mask. A conductive pattern having a cylindrical shape can be formed on the substrate. The method of forming a pattern may simplify manufacturing processes for a capacitor and a semiconductor device, and may improve their efficiencies.

13 Claims, 12 Drawing Sheets

METHODS OF FORMING A PATTERN AND METHODS OF MANUFACTURING A CAPACITOR USING THE SAME

CROSS-REFERENCE TO RELATED APPLICATIONS

This application claims priority under 35 U.S.C. §119 to Korean Patent Application No. 2006-129346, filed on Dec. 18, 2006, in the Korean Intellectual Property Office (KIPO), the contents of which are herein incorporated by reference in their entirety.

FIELD OF THE INVENTION

Example embodiments of the present invention relate to methods of forming a pattern and methods of manufacturing a capacitor using the same. Some example embodiments of the present invention relate to methods of forming a pattern having a cylindrical shape and methods of manufacturing a capacitor using the methods of forming a pattern.

BACKGROUND OF THE INVENTION

A capacitor employed in an electronic device, for example, a dynamic random access memory (DRAM) device, can include a lower electrode, a dielectric layer and an upper electrode. In order to improve the capacitance of a memory device having the capacitor, increasing the electric capacitance of the capacitor can be important. Thus, the capacitor can have a flat shape so as to have a large capacitance; however, the shape of the capacitor has gradually changed to a box shape or a cylindrical shape to have a relatively large aspect ratio, for example, because the area of a unit cell of the DRAM device recently has reduced as integration of the DRAM device has increased to the giga-size range.

A cylindrical capacitor typically includes a lower electrode having a cylindrical shape. A buffer layer pattern may be used in a node-separation process to form the lower electrode having the cylindrical shape, and examples of materials that may be used for the buffer layer pattern include an oxide, a photosensitive material, etc.

In order to form the buffer layer pattern including an oxide, a buffer oxide layer can be formed through an oxide deposition process, and then the buffer oxide layer can be etched through an etch-back process or a chemical mechanical polishing (CMP) process. As a result, forming the buffer layer pattern can take a long time for the deposition process and the etching process. Additionally, a void may be formed in the buffer layer pattern. An atomic layer deposition (ALD) process can be required to form a buffer layer pattern without the void.

In order to form the buffer layer pattern including a photosensitive material, a photoresist film is formed. Thereafter, an exposing process, a developing process using a developing solution, a cleaning process and a baking process are typically sequentially performed on the photoresist film. High-cost exposure devices can be needed to form the buffer layer pattern. Furthermore, a baking process to harden the photoresist film at a temperature more than about 270° C. may be needed. A photoresist film hardened through a high temperature baking process may not be easily removed through a plasma ashing process.

Moreover, the lower electrode of the buffer layer pattern may be damaged while the ashing process and the cleaning process are performed. The buffer layer pattern may not be easily removed by a conventional ashing process, and residue of the buffer layer pattern that remains in an opening may serve as a resistance that causes the capacitor to malfunction. In order to improve the efficiency of the ashing process for removing the buffer layer pattern, an oxygen plasma ashing process may be performed at a temperature of about 150° C. to about 250° C. However, a high temperature ashing process may deteriorate and/or oxidize the lower electrode so the capacitor may not have a desired electric capacitance.

SUMMARY OF THE INVENTION

Example embodiments of the present invention provide methods of forming a pattern of a semiconductor device using a buffer layer pattern including a siloxane polymer capable of increasing gap-filling characteristics.

Example embodiments of the present invention also provide methods of manufacturing a capacitor of a semiconductor device using the buffer layer including the siloxane polymer.

According to one aspect of the present invention, there is provided a method of forming a pattern. In the method, an oxide layer pattern having an opening is formed on a substrate. A conductive layer is formed on the oxide layer pattern and a bottom and sidewalls of the opening. A buffer layer pattern is formed in the opening having the conductive layer, the buffer layer pattern including a siloxane polymer represented by the following Chemical Formula 1. The conductive layer on the oxide layer pattern is selectively removed using the buffer layer pattern as an etching mask. A conductive pattern having a cylindrical shape can be formed on the substrate.

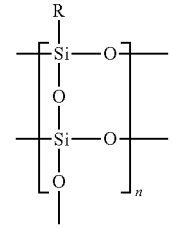

<Chemical Formula 1>

In Chemical Formula 1, R represents an alkyl group having 1 to 5 carbon atoms, and n represents a natural number.

The siloxane polymer may be formed by cross-linking a silicone compound represented by the following Chemical Formula 2, wherein OR represents an alkoxy group having 1 to 5 carbon atoms.

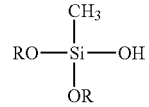

<Chemical Formula 2>

The siloxane polymer may have a number-average molecular weight of about 6,000 to about 10,000, and may have a polydispersity index (PDI) of about 1.2 to about 1.6.

In order to form the buffer layer pattern, a preliminary buffer layer may be formed to fill the opening having the conductive layer, and the preliminary buffer layer may cover the conductive layer on the mold layer. Thereafter, the preliminary buffer layer may be heated to form a buffer layer. An upper portion of the buffer layer may be etched to thereby form the buffer layer pattern in the opening of the oxide layer pattern.

The preliminary buffer layer may be formed by spin-coating a composition including about 2% to about 7% by weight of the siloxane polymer and about 93% to about 98% by weight of an organic solvent.

According to another aspect of the present invention, there is provided a method of manufacturing a capacitor. In the method, a mold layer pattern is formed on a substrate having a conductive structure, and the mold layer pattern has an opening to expose the conductive structure. A conductive layer is formed on the bottom and sidewalls of the opening and on the mold layer pattern. A buffer layer pattern is formed on the conductive layer formed in the opening. The buffer layer pattern includes a siloxane polymer represented by the following Chemical Formula 1, wherein R represents an alkyl group having 1 to 5 carbon atoms, and n represents a natural number. The conductive layer on the mold layer pattern is selectively removed to form a lower electrode on the bottom and the sidewalls of the opening. The mold layer pattern and the buffer layer pattern are removed through the same process using an aqueous solution including hydrofluoric acid. A dielectric layer is formed on the substrate having the lower electrode. An upper electrode is formed on the dielectric layer. A capacitor of a semiconductor device may be completed.

<Chemical Formula 1>

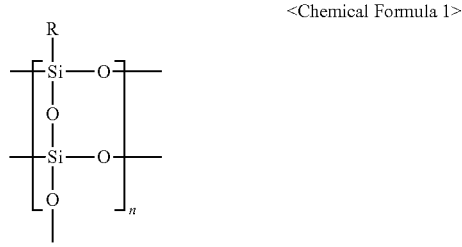

In some embodiments, a buffer layer pattern includes a siloxane polymer having a number-average molecular weight of about 6,000 to about 10,000 and being represented by Chemical Formula 1. Thus, the buffer layer pattern may have characteristics substantially similar to a silicon oxide layer pattern. Thus, the buffer layer pattern may be removed with the oxide layer pattern through a wet-etching process after a conductive layer pattern is formed. Thus, the methods of forming a pattern may simplify manufacturing processes for a capacitor and a semiconductor device, and may improve their efficiencies.

BRIEF DESCRIPTION OF THE DRAWINGS

The above and other features and advantages of the present invention will become more apparent by describing example embodiments thereof with reference to the accompanying drawings, in which.

DESCRIPTION OF THE EMBODIMENTS

Figure 1:
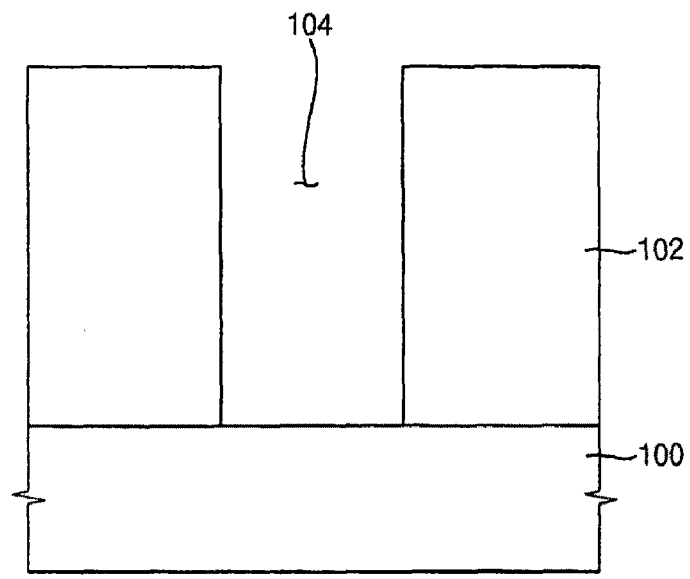
FIGS. 1 through 6 are cross-sectional views illustrating a method of forming a pattern according to example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to, or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to illustrations of cross sections that are schematic illustrations of idealized embodiments (and intermediate structures) of the present invention. As such, variations from the shapes of the illustrations, for example, of manufacturing techniques and/or tolerances, are to be expected. Example embodiments of the present invention should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of Forming a Pattern

FIGS. 1 through 6 are cross-sectional views illustrating a method of forming a pattern according to example embodiments of the present invention.

Referring to FIG. 1, an insulation layer pattern 102 is formed on a substrate 100. The insulation layer pattern 102 has an opening 104 to expose a portion of an upper surface of the substrate 100. Examples of the substrate 100 may include a silicon substrate having an insulating interlayer and a contact pad passing through the insulating interlayer. An insulation material may be deposited on the substrate 100 through a vapor deposition process to form an insulation layer. Examples of materials that may be included in the insulation layer include borophosphosilicate glass (BPSG), phosphosilicate glass (PSG), undoped silicate glass (USG), spin-on glass (SOG), plasma-enhanced tetraethyl orthosilicate (PE-TEOS) and the like. The insulation layer is patterned to form the insulation layer pattern 102. In example embodiments, the insulation layer may have a thickness of about 5,000 Å to about 20,000 Å from the upper surface of the substrate 100. The thickness of the insulation layer may vary depending on a desired thickness of a conductive pattern since the thickness of the conductive pattern formed after the insulation layer depends on the thickness of the insulation layer. Thereafter, a mask pattern (not shown) is formed on the insulation layer. The mask pattern can include a material having a high etching selectivity with respect to the insulation layer. Examples of materials that may be included in the mask pattern include silicon nitride, silicon oxide nitride and the like. The insulation layer exposed through the mask pattern is etched to expose the upper surface of the substrate 100. For example, the insulation layer may be wet-etched using a limulus amebocyte lysate (LAL) etching solution including deionized water, ammonium hydrofluoride and hydrofluoric acid to form the insulation layer pattern 102. Alternatively, the insulation layer may be dry-etched using an etching gas including hydrofluoric acid anhydride, isopropyl alcohol and/or water vapor to form the insulation layer pattern 102. Before the insulation layer is formed, an etch-stop layer may be formed on the substrate 100 to prevent damage to the substrate 100 when the insulation layer pattern 102 having the opening 104 is formed.

Figure 2:
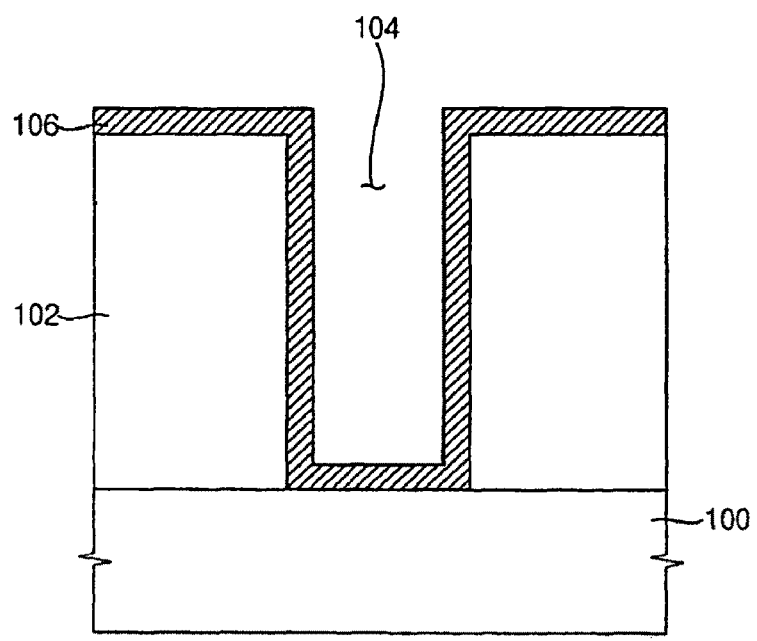

Referring to FIG. 2, a conductive layer 106 is formed on the insulation layer pattern 102 and in the opening 104. For example, a conductive material may be deposited in the opening 104 and on the insulation layer pattern 102 through a vapor deposition process to form the conductive layer 106 having a substantially uniform thickness. Examples of conductive materials include polysilicon, tungsten (W), titanium (Ti), titanium nitride (TiN), tungsten nitride (WN) and the like. These may be used alone or in a combination thereof. When a single conductive material is used, the conductive layer 106 may have a single-layer structure. When a combination of the conductive materials is used, the conductive layer 106 may have a multilayer structure. In example embodiments, the conductive layer 106 has a multilayer structure including a titanium layer and a titanium nitride layer that are sequentially deposited.

Figure 3:
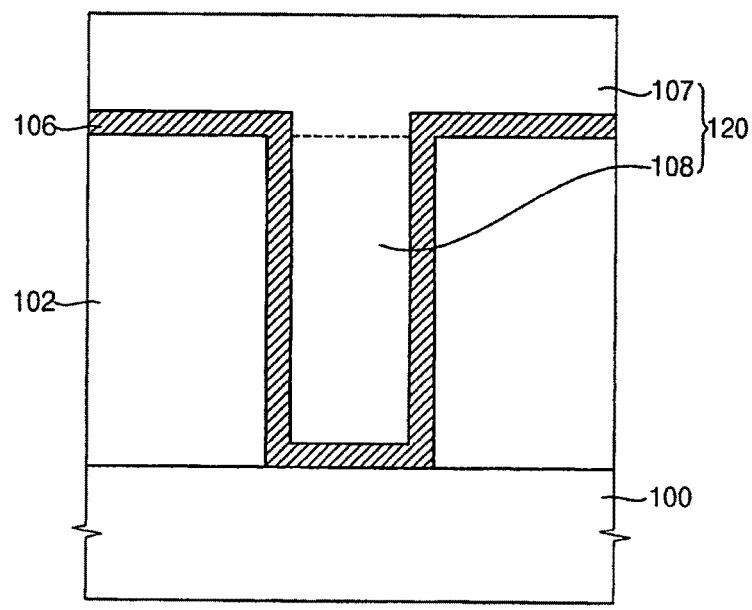

Referring to FIG. 3, a preliminary buffer layer 120 is formed to fill the opening 104 having the conductive layer 106 (portion 108) and to cover the conductive layer 106 on the insulation layer pattern 102 (portion 107).

The preliminary buffer layer 120 may be formed by spin-coating a composition including an organic solvent and a siloxane polymer represented by the following Chemical Formula 1. The number-average molecular weight of the siloxane polymer may be about 6,000 to about 10,000, and the polydispersity index (PDI) of the siloxane polymer may be about 1.2 to about 1.6. In Chemical Formula 1, R may represent an alkyl group having 1 to 5 carbon atoms, and n may be a natural number so that the number-average molecular weight of the siloxane polymer may be about 6,000 to about 10,000.

<Chemical Formula 1>

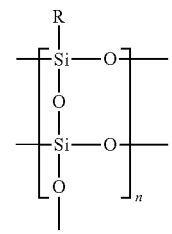

When the number-average molecular weight of the siloxane polymer is more than about 10,000, the preliminary buffer layer 120 may not fill the opening 104 sufficiently. When the number-average molecular weight of the siloxane polymer is less than about 6,000, the etch resistance of a buffer layer pattern formed through a subsequent process may be reduced. In some embodiments, the number-average molecular weight of the siloxane polymer is about 7,000 to about 9,000. The composition may include about 2% to about 7% by weight of the siloxane polymer and about 93% to about 98% by weight of the organic solvent. When the concentration of the siloxane polymer is more than about 7% by weight or less than about 2% by weight, the preliminary buffer layer 120 may not have a uniform thickness. In some embodiments, the composition includes about 4% to about 6% by weight of the siloxane polymer.

The organic solvent may control the viscosity of the composition so that the composition has characteristics suitable for spin-coating. In some embodiments, the organic solvent includes an organic solvent that is soluble in water. Examples of organic solvents include alcohols (such as methanol, ethanol, butanol, propanol, isopropyl alcohol, n-butanol, 1-methoxy-2-propanol, isobutyl alcohol, or t-butyl alcohol), methoxypropyl acetate, propylene glycol monomethyl ether acetate, propylene glycol monomethyl ether, or the like. These may be used alone or in a combination thereof. Since the concentration of the organic solvent in the composition may vary to provide a composition that is capable of being coated through a spin-coating method, the concentration of the organic solvent is not particularly limited to a specific range.

The siloxane polymer may be formed by cross-linking a silicone compound represented by the following Chemical Formula 2. In Chemical Formula 2, OR represents an alkoxy group having 1 to 5 carbon atoms. Examples of the alkoxy group may include a methoxy group, an ethoxy group, an isopropoxy group, a butoxy group and the like.

<Chemical Formula 2>

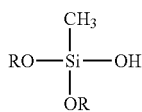

The silicone compound represented by Chemical Formula 2 may be formed by reacting a first silicone compound represented by the following Chemical Formula 3 with water ($H_2O$) to form a second silicone compound represented by the following Chemical Formula 4 and by reacting second silicone compound with an alkyl alcohol (ROH).

<Chemical Formula 3>

<Chemical Formula 4>

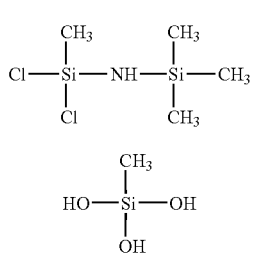

Thus, an end of the siloxane polymer may contain an alkoxy group even though the alkoxy group is not shown in Chemical Formula 1. Particularly, the end of the siloxane polymer may contain the alkoxy group since the siloxane polymer is formed by cross-linking the silicone compound represented by Chemical Formula 2. The alkoxy group in the siloxane polymer may improve characteristics of the preliminary buffer layer 120 for filling an opening, and may increase the etching selectivity of the preliminary buffer layer 120 with respect to an LAL solution.

The silicone compound represented by Chemical Formula 2 may be formed through the following Step 1, Step 2 and Step 3. In Step 3, ROH may represent an alkyl alcohol such as methanol, ethanol, propanol, butanol or the like.

<Step 1>

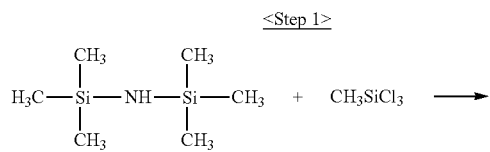

-continued

<Step 2>

<Step 3>

A baking process or a heating process is performed to harden the preliminary buffer layer pattern. For example, the baking process may be performed at a temperature of about 160° C. to about 240° C., for example, at a temperature of about 180° C. to about 220° C. As a result, a buffer layer including the siloxane polymer can be formed. The buffer layer fills the opening 104 and covers the upper surface of the conductive layer 106. The buffer layer may be a spin-on-glass layer.

Figure 4:
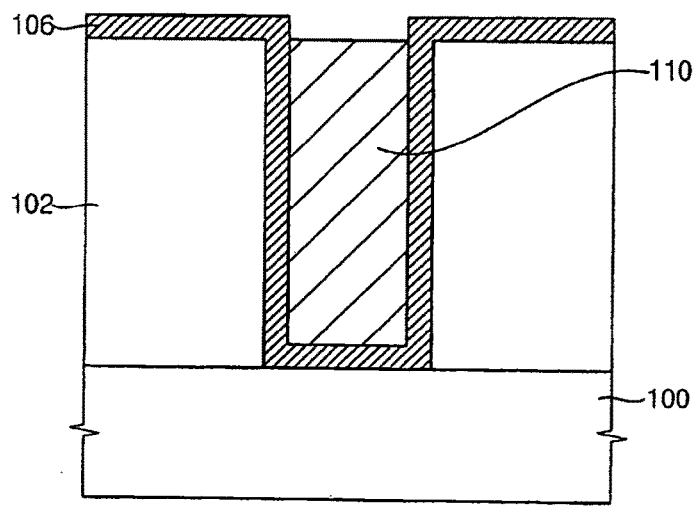

Referring to FIG. 4, portion 107 of the buffer layer 120 is then etched to expose the conductive layer 106 disposed on the insulation layer pattern 102. For example, the buffer layer 120 may be etched through a dry-etching process using hydrogen fluoride or through a wet-etching process using an etching solution including hydrofluoric acid. As a result, a buffer layer pattern 110 is formed on the conductive layer 106 in the opening 104.

Figure 5:
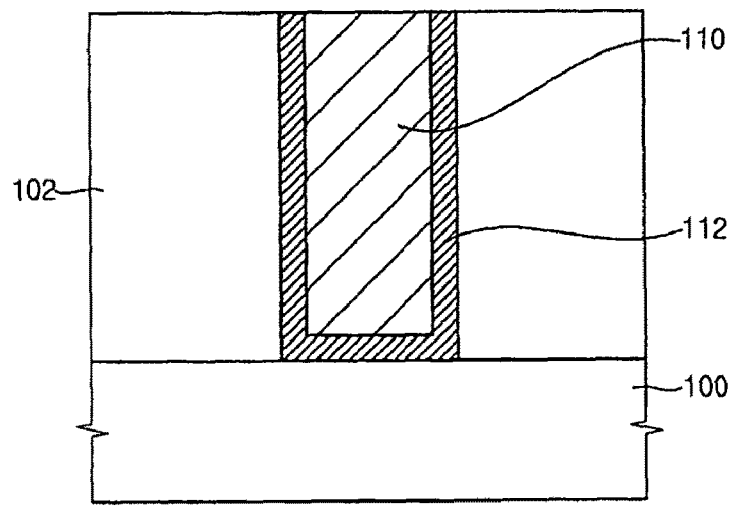

Referring to FIG. 5, the conductive layer 106 disposed on the upper surface of the insulation layer pattern 102 is etched by using the buffer layer pattern 110 as an etching mask. For example, the conductive layer 106 disposed on the upper surface of the insulation layer pattern 102 may be etched by using the buffer layer pattern 110 as a mask to expose the upper surface of the insulation layer pattern 102. Remaining portions of the conductive layer 106 form a conductive layer pattern 112 having a cylindrical shape and contacting an inner wall of the insulation layer pattern 102, which surrounds the opening 104. Damage to the conductive layer pattern 112 may be prevented and/or reduced when the conductive layer 106 is etched. After the conductive layer pattern 112 is formed, a cleaning process may be performed to remove any etching residues remaining on the insulation layer pattern 102 and the conductive layer pattern 112. For example, the cleaning process may be performed using isopropyl alcohol, deionized water and the like.

Figure 6:
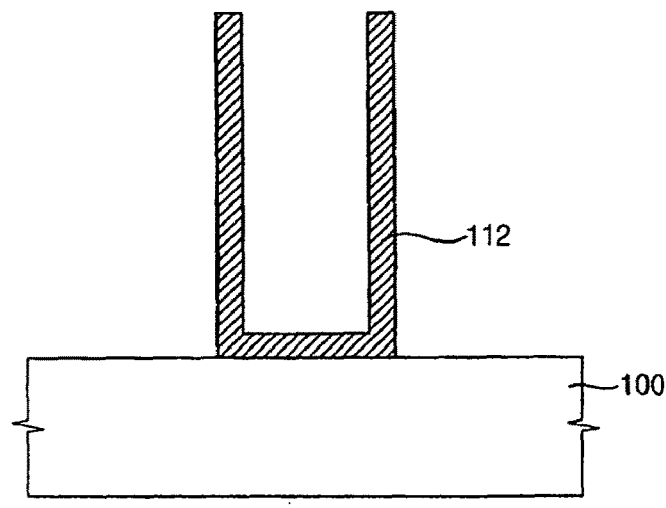

Referring to FIG. 6, the insulation layer pattern 102 on the substrate 100 is removed with the buffer layer pattern 110 surrounded by the conductive layer pattern 112. For example, the insulation layer pattern 102 and the buffer layer pattern 110 may be removed through a wet-etching process using an etching solution. The etching solution may be an LAL solution including water, hydrofluoric acid and ammonium hydrofluoride. Since both the insulation layer pattern 102 and the buffer layer pattern 110 can include silicon oxide, the insulation layer pattern 102 and the buffer layer pattern 110 may be removed through the same process using the LAL solution. After removal of the insulation layer pattern 102 and the buffer layer pattern 110, the conductive layer pattern 112 having a cylindrical shape is formed on the substrate 100. The methods of forming a pattern according to example embodiments of the present invention may be variously used in other methods of forming a cylindrical shaped pattern of a semiconductor device.

Methods of manufacturing a capacitor of a semiconductor will be described fully hereinafter.

Method of Manufacturing a Capacitor

FIGS. 7 through 15 are cross-sectional views illustrating a method of manufacturing a capacitor according to example embodiments of the present invention.

Figure 7:
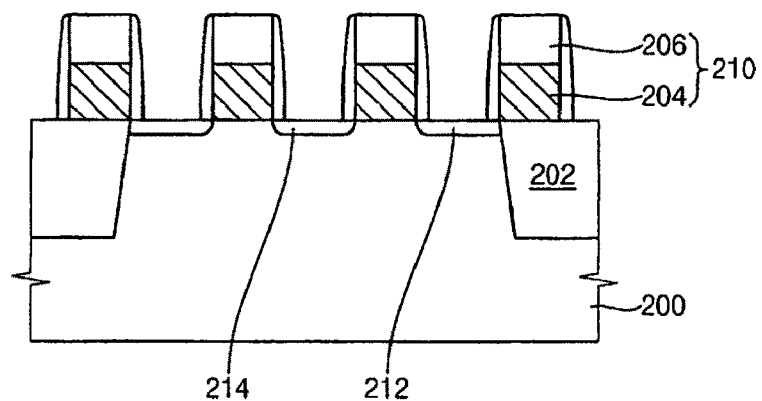
FIGS. 7 through 15 are cross-sectional views illustrating a method of manufacturing a capacitor according to example embodiments of the present invention.

Referring to FIG. 7, an isolation layer 202 is formed at an upper portion of a substrate 200, for example, a semiconductor substrate, through a shallow trench isolation (STI) process to divide the substrate 200 into an active region and a field region.

Thereafter, a gate insulation layer is formed on the substrate 200 having the isolation layer 202 through, for example, a thermal oxidation process, a chemical vapor deposition (CVD) process, an atomic layer deposition (ALD) process and the like. Examples of materials that may be used for the gate insulation layer include silicon oxide, a material having a dielectric constant substantially higher than that of silicon oxide, and the like.

A first conductive layer and a gate mask 206 are sequentially formed on the gate insulation layer. The first conductive layer may include polysilicon doped with impurities. The first conductive layer may be patterned to form a gate electrode through subsequent processes. The first conductive layer may have a multilayer structure including a doped polysilicon layer and a metal layer. The gate mask 206 may include a material having a high etching selectivity with respect to a first insulating interlayer 220 (see FIG. 8). For example, when the first insulating interlayer 220 includes an oxide, such as silicon oxide, the gate mask 206 may include a nitride, such as silicon nitride.

Thereafter, the first conductive layer and the gate insulation layer are sequentially patterned by using the gate mask 206 as an etching mask. Thus, a plurality of gate structures 210 is formed on the substrate 200, wherein each of the gate structures 210 includes a gate insulation layer pattern, a gate electrode 204 and the gate mask 206.

Thereafter, a silicon nitride layer is formed on the substrate 200 having the gate structures 210, and then anisotropically etched to form a gate spacer at both sidewalls of each of the gate structures 210.

Impurities are implanted into the substrate 200 exposed between the gate structures 210 through an ion implantation process by using the gate structures 210 having the gate spacer as a mask. Thereafter, a first contact region 212 and a second contact region 214, which correspond to source/drain regions, are formed on the substrate 200 through a thermal treatment process. The first contact region 212 corresponds to a capacitor contact region making contact with a first pad 222, and the second contact region 214 corresponds to a bit line contact region making contact with a second pad 224. As a result, a plurality of transistors is formed on the substrate 200, wherein each of the transistors includes the gate structure 210, the first contact region 212 and the second contact region 214.

Figure 8:
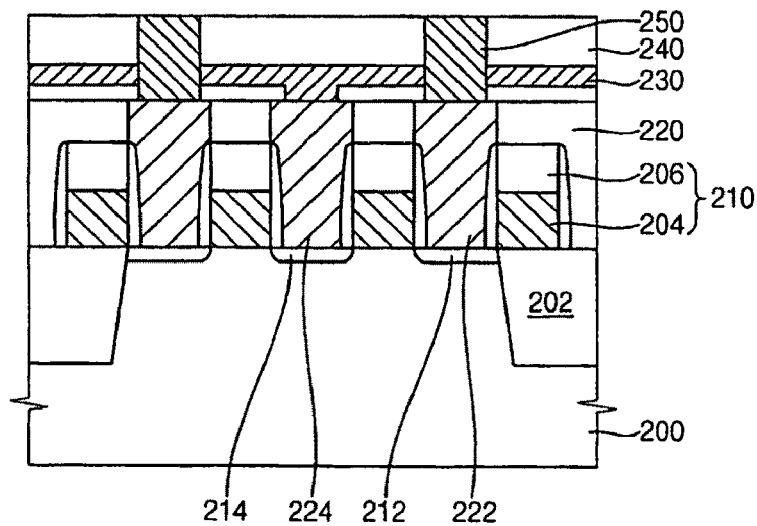

Referring to FIG. 8, a first insulating interlayer 220 is formed on the substrate 200. The first insulating interlayer 220 covers the transistor and includes an oxide. The first insulating interlayer 220 may be formed through a CVD process, a plasma-enhanced chemical vapor deposition (PECVD) process, a high-density plasma chemical vapor deposition (HDP-CVD) process, an ALD process and the like.

Thereafter, an upper portion of the first insulating interlayer 220 is removed through a chemical mechanical polishing (CMP) process to planarize an upper surface of the first insulating interlayer 220. In example embodiments, the first insulating interlayer 220 has a predetermined thickness from an upper surface of the gate mask 206.

A first photoresist pattern (not shown) is then formed on the first insulating interlayer 220. Thereafter, the first insulating interlayer 220 is partially anisotropically etched by using the first photoresist pattern as an etching mask to form a plurality of first contact holes (not shown) through the first insulating interlayer 220. The first contact holes expose the first contact region 212 and the second contact region 214. A portion of the first contact holes exposes the first contact region 212 corresponding to the capacitor contact region. A remainder of the first contact holes exposes the second contact region 214 corresponding to the bit line contact region. The first photoresist pattern is then removed through an ashing process and/or a stripping process.

A second conductive layer is formed to fill the first contact holes and to cover the first insulating interlayer 220. Examples of materials that may be used for the second conductive layer include polysilicon doped with impurities of a high concentration, a metal, a conductive metal nitride and the like. The second conductive layer is then etched through a CMP process and/or an etch-back process to expose the upper surface of the first insulating interlayer 220. Thus, a first pad 222 and a second pad 224 are formed in the first contact holes. The first pad 222 is electrically connected to the capacitor contact region, and the second pad 224 is electrically connected to the bit line contact region.

A second insulating interlayer (not shown) is formed on the first insulating interlayer 220 having the first pad 222 and the second pad 224. The second insulating interlayer may serve to electrically separate the first pad 222 from a bit line formed through subsequent processes. Thereafter, a CMP process is performed to planarize an upper portion of the second insulating interlayer.

A second photoresist pattern (not shown) is formed on the planarized second insulating interlayer. The second insulating interlayer is partially etched by using the second photoresist pattern as an etching mask to form a second contact hole (not shown) through the second insulating interlayer. The second contact hole exposes the second pad 224. The second contact hole corresponds to a bit line contact hole for electrically connecting the second pad 224 to the bit line. The second photoresist pattern is then removed through an ashing process and/or a stripping process.

A third conductive layer (not shown) is then formed on the second insulating interlayer. The third conductive layer fills the second contact hole. The third conductive layer is patterned to form a bit line 230 electrically connected to the second pad 224. The bit line 230 may include a first layer and a second layer. The first layer may include a metal and a metal oxide, and the second layer may include a metal. For example, the first layer may include titanium/titanium nitride (Ti/TiN), and the second layer may include tungsten (W).

Thereafter, a third insulating interlayer 240 is formed to cover the second insulating interlayer having the bit line 230. Examples of materials that may be used for the third insulating interlayer 240 include BPSG, PSG, USG, SOG, PE-TEOS, HDP-CVD oxide, or the like.

A third photoresist pattern (not shown) is then formed on the third insulating interlayer 240. The second insulating interlayer and the third insulating interlayer 240 are partially etched by using the third photoresist pattern as an etching mask to form a plurality of third contact holes exposing the first pad 222. A contact pad of a capacitor may be formed in each of the third contact holes.

A fourth conductive layer is then formed on the third insulating interlayer 240. The fourth conductive layer fills the third contact holes. A CMP process is performed on the fourth conductive layer to form a third pad 250 in each of the third contact holes. An example of a material that may be used for the third pad 250 includes polysilicon, into which impurities are doped. The third pad 250 may serve to connect the first pad 222 to a lower electrode formed through subsequent processes.

Figure 9:
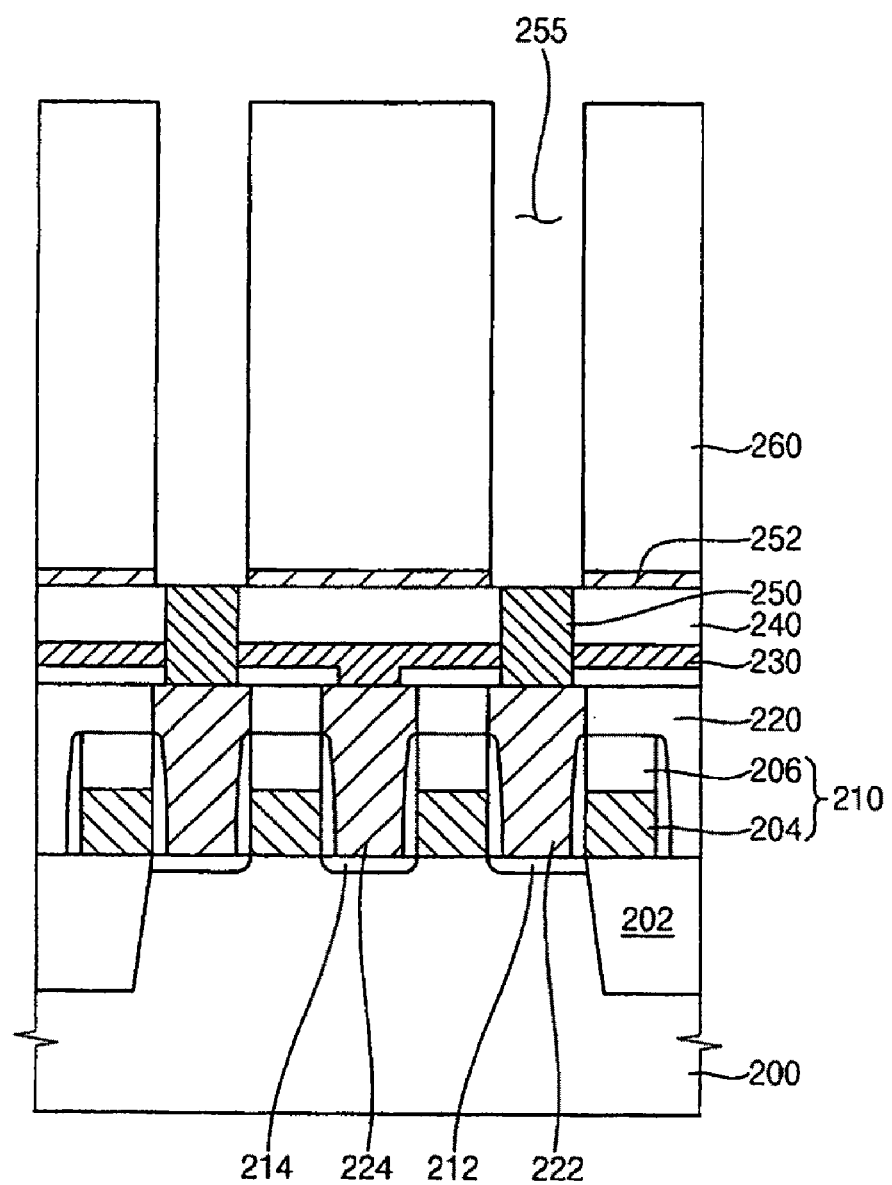

Referring to FIG. 9, an etch-stop layer 252 is formed on the third pad 250 and on the third insulating interlayer 240. The etch-stop layer 252 may serve to protect the third pad 250 when a mold layer 260 is selectively etched through subsequent processes to form an opening 255 through the mold layer 260. The thickness of the etch-stop layer 252 may be about 10 Å to about 200 Å. The etch-stop layer 252 may include a material having a low etching selectivity with respect to the mold layer 260, for example, a nitride, a metal oxide, and the like.

The mold layer 260 is formed on the etch-stop layer 252. Examples of materials that may be used for the mold layer may 260 include silicon oxide, BPSG, PSG, USG, SOG, TEOS, HDP-CVD oxide or the like. The mold layer 260 may have a double-layer structure formed by depositing the materials sequentially. When the mold layer 260 has a double-layer structure including at least two layers having different etching ratios, the shape of a sidewall of a lower electrode of a capacitor, which is formed through subsequent processes, may be changed. The thickness of the mold layer 260 may vary depending on the desired capacitance of a capacitor. Since the height of a capacitor depends on the thickness of the mold layer 260, the thickness of the mold layer 260 may vary so as to form a capacitor having a desired capacitance.

Thereafter, the mold layer 260 and the etch-stop layer 252 are partially etched to form an opening 255 to expose the third contact 250. When the opening 255 is formed, the etch-stop layer 252 may be over-etched to entirely remove the etch-stop layer 252 on the bottom of the opening 255. Thus, an upper portion of the third contact 250 may be partially etched when the etch-stop layer 252 is etched.

Figure 10:
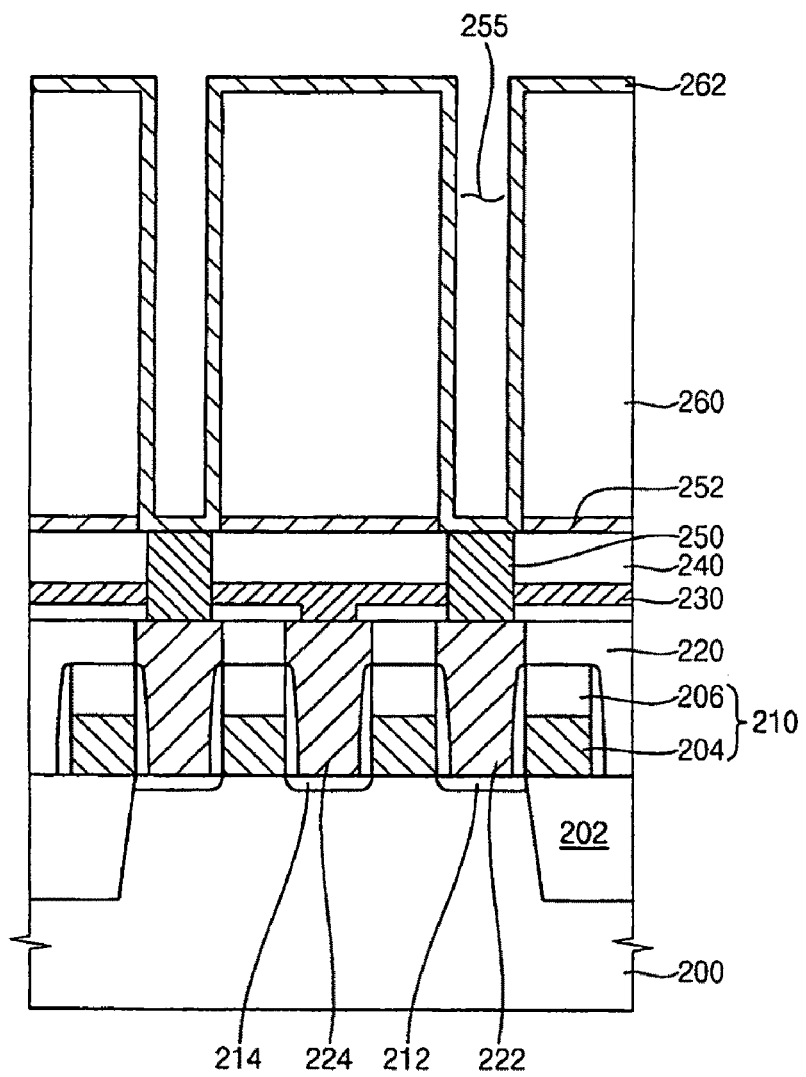

Referring to FIG. 10, a conductive layer 262 for forming a lower electrode is continuously formed at the sidewall and the bottom of the opening 255 and on the mold layer 260. The conductive layer 262 includes a material different from the third contact 250. For example, the conductive layer 262 may include a metal, a metal-containing material and the like. Examples of materials that may be used for the conductive layer 262 include titanium, titanium nitride and the like. The conductive layer 262 may have a multilayer structure. For example, the conductive layer 262 may have a double-layer structure including a titanium layer and a titanium nitride layer. When the conductive layer 262 does not include polysilicon but includes a metal, a metal-containing material and the like, a depletion layer is not formed at an interface between a lower electrode and a dielectric layer, which are formed through subsequent processes. Thus, the capacitance of a capacitor may be increased. Since the conductive layer 262 is formed on an inner surface of the opening having a relatively large aspect ratio, the conductive layer 262 may be formed through a deposition method having relatively good step-coverage characteristics. In some example embodiments, the conductive layer 262 has a relatively thin thickness so as to not entirely fill the opening 255. Thus, the conductive layer 262 may be formed through, for example, a CVD process, a cyclic CVD process, an ALD process and the like.

Figure 11:
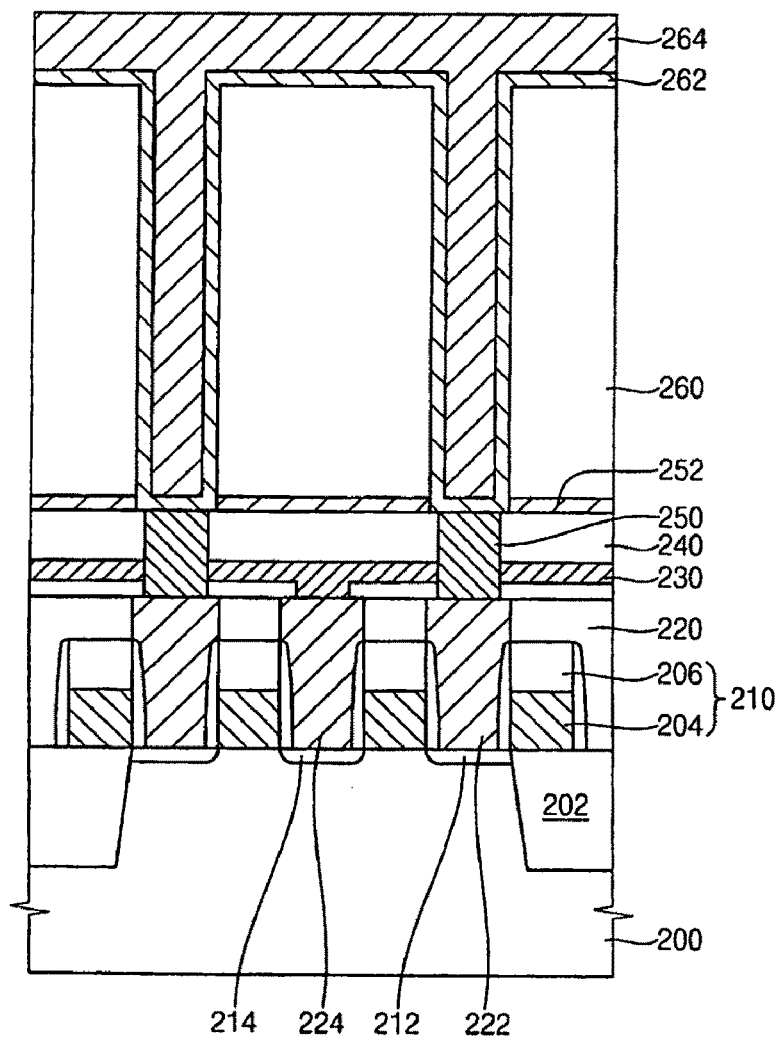

Referring to FIG. 11, a preliminary buffer layer 264 is formed to fill the opening 255 and to cover the conductive layer 262. For example, the preliminary buffer layer 264 may be formed by coating a composition including about 2% to about 7% by weight of a siloxane polymer represented by Chemical Formula 1 and about 93% to about 98% by weight of an organic solvent. The number-average molecular weight of the siloxane polymer may be about 6,000 to about 10,000, and the PDI of the siloxane polymer may be about 1.2 to about 1.6. In Chemical Formula 1, R may represent an alkyl group having 1 to 5 carbon atoms, and n may be a natural number such that the number-average molecular weight of the siloxane polymer may be about 6,000 to about 10,000.

For example, the siloxane polymer may be formed by cross-linking a silicone compound represented by Chemical Formula 2. Thus, an end of the siloxane polymer may contain an alkoxy group even though the alkoxy group is not shown in Chemical Formula 1. Particularly, the end of the siloxane polymer may contain the alkoxy group since the siloxane polymer is formed by cross-linking the silicone compound represented by Chemical Formula 2. The alkoxy group in the siloxane polymer may improve characteristics of the preliminary buffer layer 264 for filling an opening, and may increase the etching selectivity of the preliminary buffer layer 264 with respect to an LAL solution.

The siloxane polymer and the polysiloxane composition are substantially the same as the above-explained siloxane polymer and the above-explained composition. Thus, any further explanations in these regards will be omitted. The preliminary buffer layer 264 in example embodiments is formed using the composition including the siloxane polymer. Thus, a high-cost exposing device may be not required.

Figure 12:
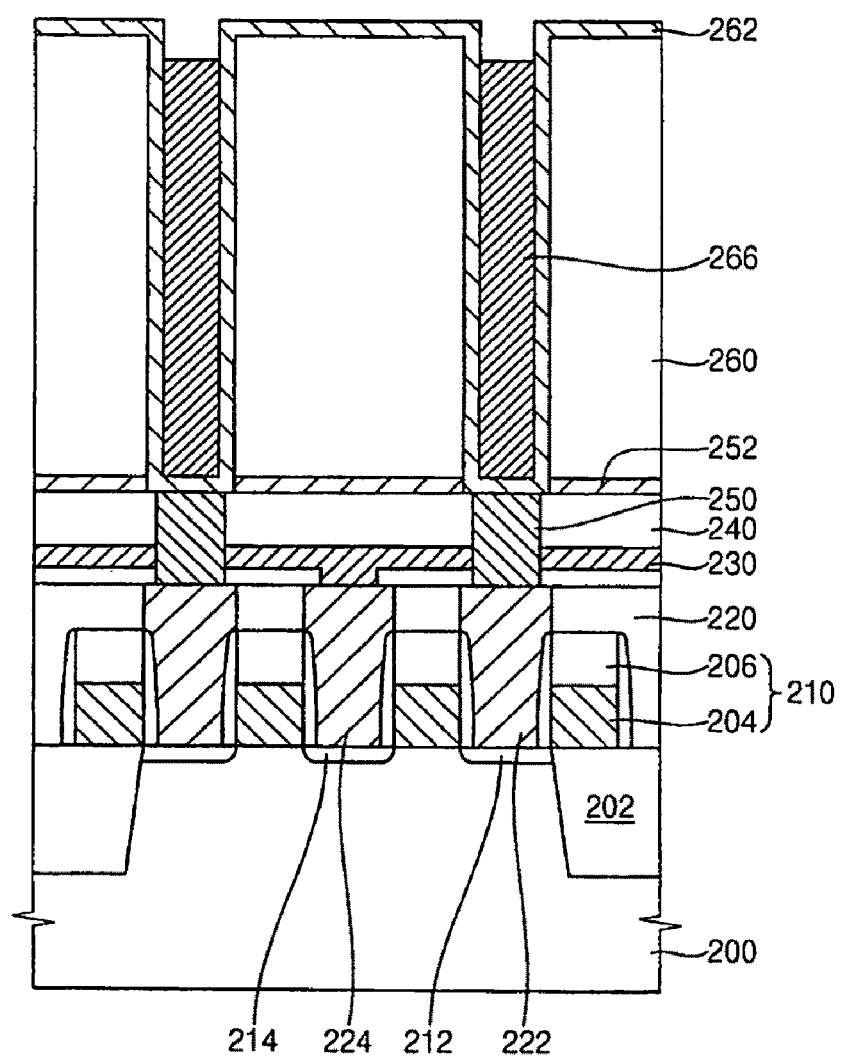

Referring to FIG. 12, the preliminary buffer layer pattern is baked and cured. For example, the preliminary buffer layer pattern may be baked at a temperature of about 160° C. to about 240° C., for example, at a temperature of about 180° C. to about 220° C. Thus, a buffer layer is formed. The buffer layer may be a spin-on-glass layer to fill the opening and to cover an upper surface of the conductive layer 262. Thereafter, the buffer layer is etched to expose the conductive layer disposed on the mold layer. For example, the buffer layer may be etched through a wet-etching process using an etching solution including hydrofluoric acid. As a result, a buffer layer pattern 266 is formed on the conductive layer in the opening.

Figure 13:
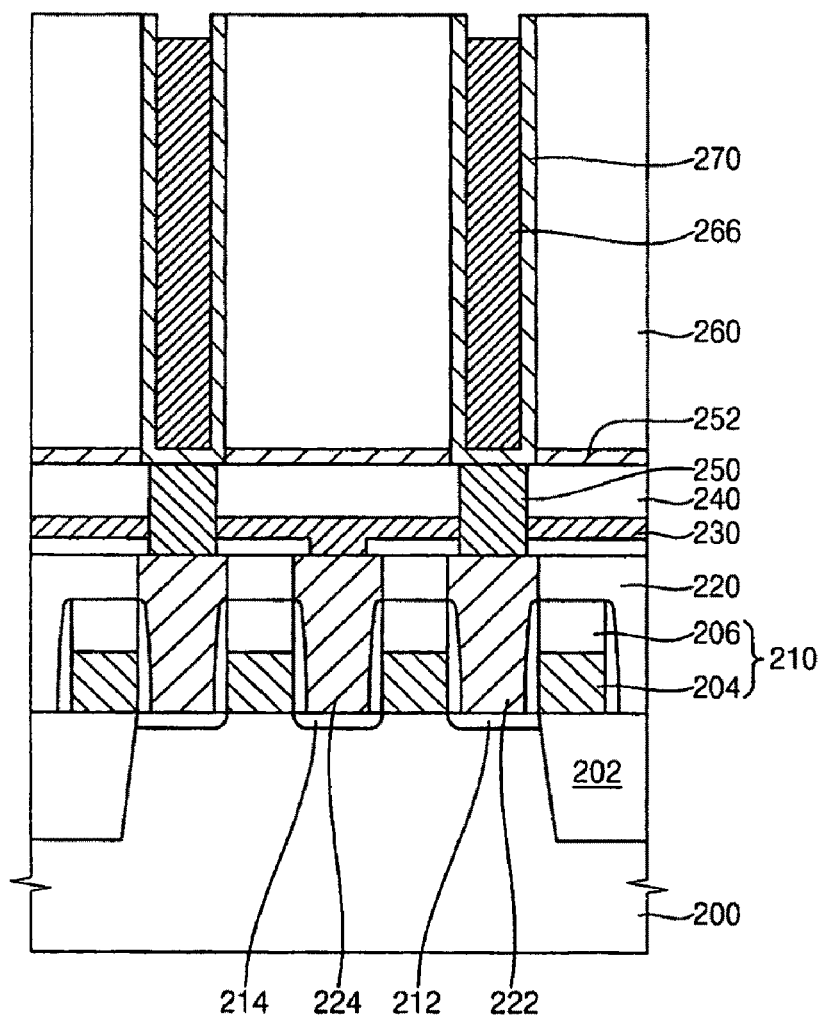

Referring to FIG. 13, the conductive layer 262 disposed on the mold layer 260 is removed to form a lower electrode 272. For example, the conductive layer 262 may be etched using the buffer layer pattern 266 as an etching mask to expose an upper surface of the mold layer 260. Thus, the lower electrode 270 making contact with a sidewall surrounding the opening 255 and having a cylindrical shape is formed. The buffer layer pattern 266 remains in a cylinder of the lower electrode 270, and an outer sidewall of the lower electrode 270 is surrounded by the mold layer 260.

Figure 14:
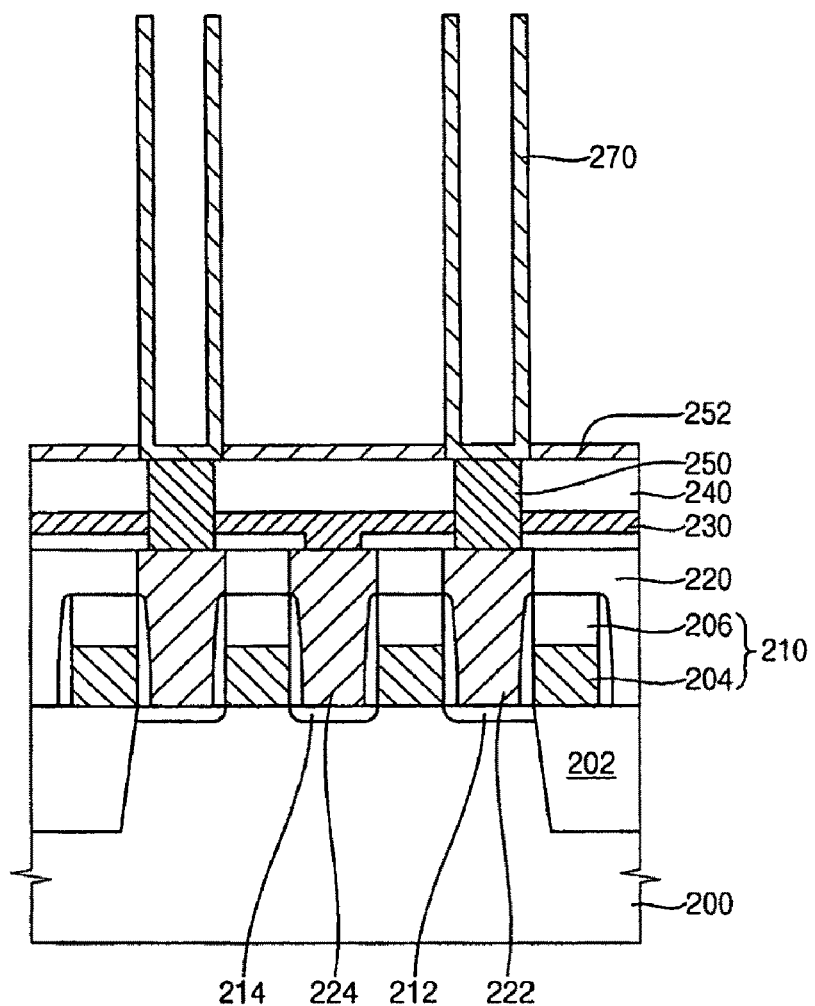

Referring to FIG. 14, the mold layer 260 and the buffer layer pattern 266 is removed through a wet-etching process using an etching solution. Since both the mold layer 260 and the buffer layer pattern 266 can include an oxide, the mold layer 260 and the buffer layer pattern 266 may be removed in the same process, that is, a wet-etching process using an aqueous solution including hydrofluoric acid, such as an LAL solution including water, hydrofluoric acid and ammonium hydrofluoride. The LAL solution may further include a metal corrosion inhibitor and a surfactant to prevent corrosion of the lower electrode and to prevent adsorption of an oxide.

Figure 15:
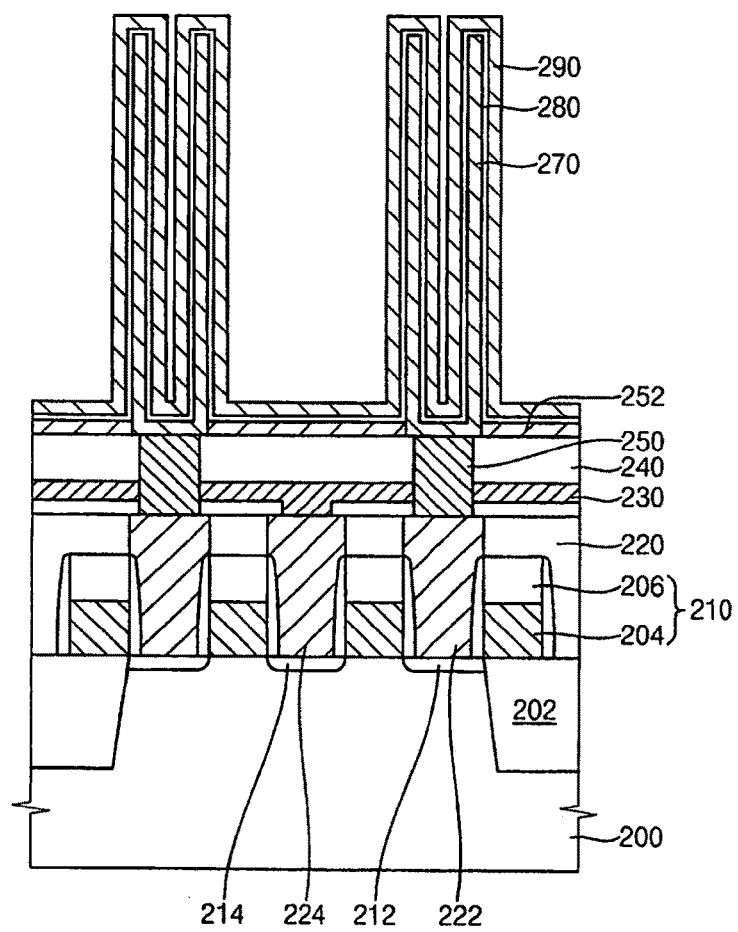

Referring to FIG. 15, a dielectric layer 280 having a uniform thickness is formed on the lower electrode 270. For example, a metal oxide having a relatively high dielectric constant may be deposited through a vapor deposition method to form the dielectric layer 280. Examples of metal oxides include aluminum oxide, hafnium oxide and the like.

Thereafter, an upper electrode 290 is formed on the dielectric layer 280. The upper electrode 290 may include a metal, a material containing a metal and the like. Alternatively, after a metal or a material containing a metal is deposited to form a lower layer, polysilicon may be deposited on the lower layer to form the upper electrode 290 having a multilayer structure. A dynamic random access memory (DRAM) device may be completed through the above-mentioned processes.

Hereinafter, embodiments of the present invention are described more fully with reference to synthetic examples and evaluations of the composition.

Synthetic Example 1

Synthesis of First Silicone Compound

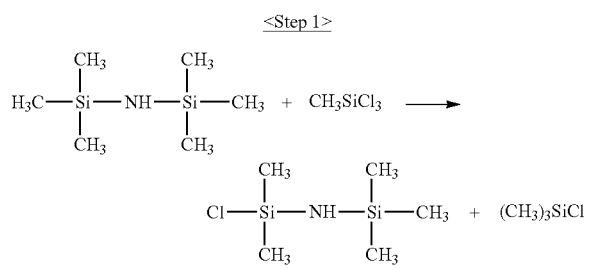

A first silicone compound represented by the following Chemical Formula 3 was prepared through synthetic processes based on the above Step 1.

<Chemical Formula 3>

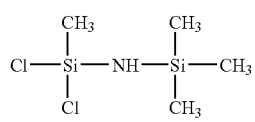

Hydrogen nuclear magnetic resonance spectroscopy was performed to confirm the first silicone compound represented by Chemical Formula 3. For the hydrogen nuclear magnetic resonance spectroscopy, benzene was used as a solvent, and a 300-MHz nuclear magnetic resonance device was used. As a result of the spectroscopy, the hydrogen nuclear magnetic resonance spectrum was δ 0.03 ppm (s, 9H), and 0.47 ppm (s, 3H).

Synthetic Example 2

Synthesis of Second Silicone Compound

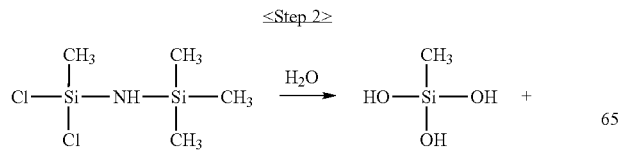

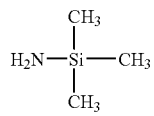

A second silicone compound represented by the following Chemical Formula 4 was prepared through synthetic processes based on the above Step 2. Particularly, water was slowly dropped into dichloromethylsilazane in a dry ice bath, of which the temperature was about −73° C., for about thirty minutes to control the reaction so that the second silicone compound was prepared. The second silicone compound was methyltrisilanol.

<Chemical Formula 4>

Synthetic Example 3

Synthesis of Silicone Compound Containing an Alkoxy Group

Methanol was dropped into methyltrisilanol represented by Chemical Formula 4 to substitute a methoxy group for a hydroxyl group of methyltrisilanol so that a siloxane compound represented by the following Chemical Formula 2 was prepared. In Chemical Formula 2, RO represents a methoxy group.

<Chemical Formula 2>

Gas chromatography-mass spectrometry (GC/MS) revealed the siloxane compound as methyldimethoxysilanol.

Example 1

Preparation of Polysiloxane Composition

A siloxane polymer represented by Chemical Formula 5 was dissolved in propylene glycol monomethyl ether acetate to prepare a polysiloxane composition. The polysiloxane composition included about 4% by weight of the siloxane polymer and about 96% by weight of propylene glycol monomethyl ether acetate. The number-average molecular weight of the siloxane polymer was about 8,000, and the PDI of the siloxane polymer was about 1.4.

<Chemical Formula 5>

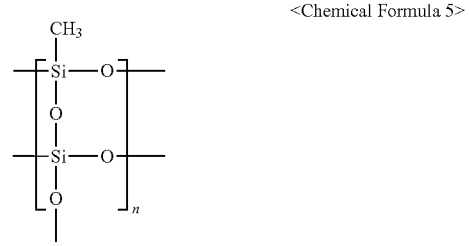

Evaluation of Gap-Filling Characteristics

The polysiloxane composition of Example 1 was spin-coated on a substrate having a mold layer pattern having an opening and a lower electrode layer (Ti/TiN) disposed on the mold layer pattern to form a coating layer. The depth of the opening was about 1,000 Å, and the thickness of the lower electrode layer was about 500 nm. Thereafter, the coating layer was baked to form a buffer layer. After the buffer layer was cut, a cross-section of the buffer layer was measured by a scanning electron microscope to evaluate the coating uniformity and the gap-filling characteristics of the polysiloxane composition. The results are shown in FIG. 16.

Figure 16:
FIG. 16 is a scanning electron microscopic (SEM) picture showing a cross-section of a buffer layer formed using a polysiloxane composition according to an example.

FIG. 16 is a scanning electron microscope (SEM) picture showing a cross-section of the buffer layer formed using the polysiloxane composition according to Example 1. Referring to FIG. 16, the buffer layer formed using the polysiloxane composition entirely filled the opening and covered the mold layer pattern. Furthermore, a surface of the buffer layer formed on the mold layer pattern was uniform. Thus, the buffer layer formed using the polysiloxane composition may be used for forming a lower electrode of a capacitor.

Evaluation of Residual Characteristics

A substrate was prepared. The substrate included a mold layer pattern (silicon oxide layer pattern) having an opening, a lower electrode having a cylindrical shape and being disposed in the opening and a buffer layer pattern being surrounded by the lower electrode in the opening and including the polysiloxane composition of Example 1. Thereafter, the buffer layer pattern and the mold layer pattern were removed through the same process using an LAL solution. The substrate was observed by a scanning electron microscope to evaluate residual characteristics of the buffer layer pattern. The results are shown in FIG. 17.

Figure 17:
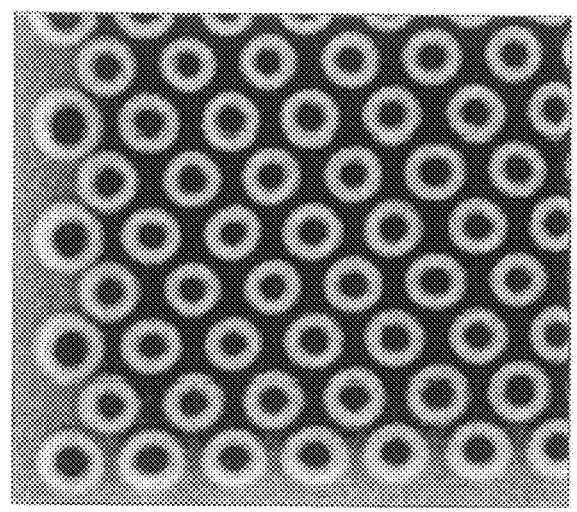
FIG. 17 is an SEM picture showing a substrate after a buffer layer pattern is removed, the buffer layer being formed using a polysiloxane composition according to an example.

FIG. 17 is an SEM picture showing a substrate after a buffer layer pattern is removed, the buffer layer being formed using the polysiloxane composition according to Example 1. Referring to FIG. 17, the buffer layer pattern and the mold layer pattern were removed in the same process using the LAL solution. Furthermore, etching residues of the buffer layer pattern did not remain on the substrate and on a surface of the lower electrode after the buffer layer pattern was removed. Thus, the buffer layer pattern formed using the polysiloxane composition may be used for forming a lower electrode of a capacitor.

In some embodiments, a buffer layer pattern includes a siloxane polymer having a number-average molecular weight of about 6,000 to about 10,000 and being represented by Chemical Formula 1. The buffer layer pattern may have characteristics substantially similar to a silicon oxide layer pattern and so may be removed with the oxide layer pattern through a wet-etching process after a conductive layer pattern is formed. Thus, the method of forming a pattern may simplify manufacturing processes for a capacitor and a semiconductor device, and may improve their efficiencies.

The foregoing is illustrative and is not to be construed as limiting. Although example embodiments of the present invention have been described, those skilled in the art will readily appreciate that many modifications are possible without materially departing from the novel teachings and advantages described herein. Accordingly, all such modifications are intended to be included within the scope of the present invention as defined in the claims. It is to be understood that the foregoing is illustrative and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a pattern, the method comprising:
    forming an oxide layer pattern having an opening on a substrate;
    forming a conductive layer on the oxide layer pattern and a bottom and sidewalls of the opening;
    forming a buffer layer pattern on the conductive layer formed in the opening, the buffer layer pattern including a siloxane polymer represented by the following Chemical Formula 1, wherein R represents an alkyl group having 1 to 5 carbon atoms, and n represents a natural number; and
    selectively removing the conductive layer on the oxide layer pattern using the buffer layer pattern as an etching mask

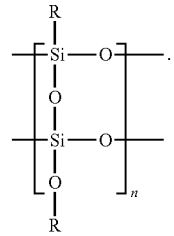

<Chemical Formula 1>

2. The method of claim 1, wherein the siloxane polymer has a number-average molecular weight of about 6,000 to about 10,000.

3. The method of claim 1, wherein the siloxane polymer has a polydispersity index (PDI) of about 1.2 to about 1.6.

4. The method of claim 1, wherein the siloxane polymer is formed by cross-linking a silicone compound represented by the following Chemical Formula 2, wherein OR represents an alkoxy group having 1 to 5 carbon atoms

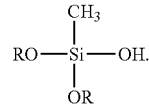

<Chemical Formula 2>

5. The method of claim 4, wherein the silicone compound is formed by:
    reacting a first silicone compound represented by the following Chemical Formula 3 with water to form a second silicone compound represented by the following Chemical Formula 4; and
    reacting the second silicone compound with an alkyl alcohol

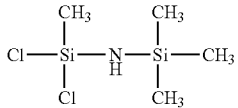

<Chemical Formula 3>

-continued

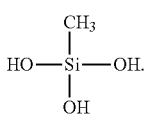

<Chemical Formula 4>

6. The method of claim 1, wherein forming a buffer layer pattern comprises:
   forming a preliminary buffer layer to fill the opening having the conductive layer and to cover the conductive layer on the oxide layer pattern;
   heating the preliminary buffer layer to form a buffer layer; and
   etching an upper portion of the buffer layer to form the buffer layer pattern in the opening.

7. The method of claim 6, wherein the preliminary buffer layer is formed by spin-coating a polysiloxane composition including about 2% to about 7% by weight of the siloxane polymer and about 93% to about 98% by weight of an organic solvent.

8. A method of forming a capacitor, the method comprising:
   forming a mold layer pattern on a substrate having a conductive structure, the mold layer pattern having an opening to expose the conductive structure;
   forming a conductive layer on a bottom and sidewalls of the opening and on the mold layer pattern;
   forming a buffer layer pattern on the conductive layer formed in the opening, the buffer layer pattern including a siloxane polymer represented by the following Chemical Formula 1, wherein R represents an alkyl group having 1 to 5 carbon atoms, and n represents a natural number;
   selectively removing the conductive layer on the mold layer pattern to form a lower electrode on the bottom and the sidewalls of the opening;
   removing the mold layer pattern and the buffer layer pattern through the same process using an aqueous solution including hydrofluoric acid;
   forming a dielectric layer on the substrate having the lower electrode; and
   forming an upper electrode on the dielectric layer <Chemical Formula 1>

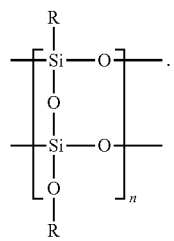

9. The method of claim 8, wherein the siloxane polymer has a number-average molecular weight of about 6,000 to about 10,000, and has a PDI of about 1.2 to about 1.6.

10. The method of claim 8, wherein forming a buffer layer pattern comprises:
    forming a preliminary buffer layer to fill the opening having the conductive layer and to cover the conductive layer on the oxide layer pattern by spin-coating a polysiloxane composition including about 2% to about 7% by weight of the siloxane polymer and about 93% to about 98% by weight of an organic solvent;
    heating the preliminary buffer layer at a temperature about 160° C. to about 240° C. to form a buffer layer; and
    etching an upper portion of the buffer layer to form the buffer layer pattern in the opening.

11. The method of claim 8, wherein the mold layer pattern includes a silicon oxide.

12. The method of claim 8, wherein the siloxane polymer is formed by cross-linking a silicone compound represented by the following Chemical Formula 2, wherein OR represents an alkoxy group having 1 to 5 carbon atoms <Chemical Formula 2>

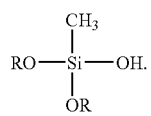

13. The method of claim 12, wherein the silicone compound is formed by:
    reacting a first silicone compound represented by the following Chemical Formula 3 with water to form a second silicone compound represented by the following Chemical Formula 4; and
    reacting the second silicone compound with an alkyl alcohol <Chemical Formula 3>

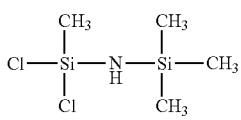

<Chemical Formula 4>

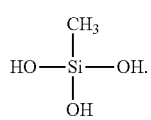

* * * * *